(12) United States Patent
Goux et al.

(10) Patent No.: US 11,342,903 B2
(45) Date of Patent: May 24, 2022

(54) BANDPASS FILTER

(71) Applicant: COMMISSARIAT A L'ENERGIE ATOMIQUE ET AUX ENERGIES ALTERNATIVES, Paris (FR)

(72) Inventors: Nicolas Goux, Grenoble (FR); Franck Badets, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/247,331

(22) Filed: Dec. 7, 2020

(65) Prior Publication Data

US 2021/0184655 A1 Jun. 17, 2021

(30) Foreign Application Priority Data

Dec. 11, 2019 (FR) ........................................ 1914201

(51) Int. Cl.
*H03J 3/08* (2006.01)
*H03D 3/00* (2006.01)
(Continued)

(52) U.S. Cl.
CPC .............. *H03J 3/08* (2013.01); *H03D 3/005* (2013.01); *H03H 11/04* (2013.01); *H03L 7/24* (2013.01); *H03J 2200/36* (2013.01)

(58) Field of Classification Search
CPC ... H03L 7/24; H03L 7/06; H03L 7/083; H04L 7/027; H04L 7/033; H04L 27/22;
(Continued)

(56) References Cited

U.S. PATENT DOCUMENTS 5,650,749 A 7/1997 Main
6,133,802 A * 10/2000 Ma ........................ H03B 5/364
329/324

(Continued)

FOREIGN PATENT DOCUMENTS

EP 1 535 395 B1 6/2005
FR 3 006 130 A1 11/2014

OTHER PUBLICATIONS

Banerjee, et al., "Analysis of Phase-Locking in Optoelectronic Microwave Oscillators Due to Small RF Signal Injection", IEEE Journal of Quantum Electronics, vol. 53, Issue: 3, Jun. 1, 2017.

(Continued)

*Primary Examiner* — Ryan Johnson
(74) *Attorney, Agent, or Firm* — BakerHostetler (57) ABSTRACT

A bandpass filter configured to receive a temporally modulated periodic input signal Vin(t), and to deliver an output signal Vout(t), and includes, in combination: a phase comparator configured to receive, on a first input, the temporally modulated periodic input signal Vin(t) as first signal, and to generate an output signal with a variable duty cycle; coupled to an injection-locked oscillator configured to receive as input, the output signal from the phase comparator, and to generate a signal Vr(t) that is phase-offset with respect to the output signal from the phase comparator; the phase-offset signal being applied to a second input of the phase comparator as second input signal; and the output signal from the phase comparator being the output signal Vout(t) from the bandpass filter and being representative of the phase difference between the two input signals Vin(t) and Vr(t).

11 Claims, 8 Drawing Sheets

(51) Int. Cl.
*H03L 7/24* (2006.01)
*H03H 11/04* (2006.01)

(58) Field of Classification Search
CPC ....... H04L 27/2272; H03D 3/24; H03J 7/045; H03H 11/04
See application file for complete search history.

(56) References Cited

U.S. PATENT DOCUMENTS

| | | | | |
|---|---|---|---|---|
| 10,826,502 | B1* | 11/2020 | Badizadegan | H03L 7/085 |
| 2012/0074959 | A1* | 3/2012 | Lee | G07D 5/08 |
| | | | | 324/655 |
| 2013/0195157 | A1 | 8/2013 | Xu | |

OTHER PUBLICATIONS

Oh, et al., "An Acoustic Signal Processing Chip With 142-nW Voice Activity Detection Using Mixer-Based Sequential Frequency Scanning and Neural Network Classification," IEEE Journal of Solid-State Circuits, vol. 54, No. 11, pp. 3005-3016, Nov. 2019.

Adler, "A Study of Locking Phenomena in Oscillators", Proceedings of the IEEE, vol. 60, No. 10, pp. 1380-1385, Oct. 1973.

Leene, et al.,"Time Domain Processing Techniques Using Ring Oscillator-Based Filter Structures", IEEE Transactions on Circuits and Systems I: Regular Papers, vol. 64, No. 12, pp. 3003-3012, Dec. 2017.

Drost, "Analog Filter Design Using Ring Oscillator Integrators", IEEE Journal of Solid-State Circuits, vol. 47, Issue: 12, pp. 3120-3129, Dec. 2012.

Franck, "Contribution à l'étude de la synchronisation des oscillateurs : intégration des oscillateurs synchrones dans les systèmes radiofréquences en technologie silicium", Theses, Engineering Sciences, Physics, 2000.

Main, et al., "FM demodulation using an injection-locked oscillator", 2000 IEEE MTT-S International, Microwave Symposium Digest, vol. 1, pp. 135-138, Jun. 2000.

* cited by examiner

BANDPASS FILTER

CROSS-REFERENCE TO RELATED APPLICATIONS

This application claims priority to foreign French patent application No. FR 1914201, filed on Dec. 11, 2019, the disclosure of which is incorporated by reference in its entirety.

FIELD OF THE INVENTION

The invention lies in the field of bandpass filters, and relates more particularly to such a filter in the phase domain.

BACKGROUND

Numerous electronics applications use filters to process signals that are modulated in a duty cycle of a square-wave signal, also called pulse width-modulated or PWM signals.

One of these applications is that of sensor interfaces, in particular ultra-low-consumption sensor interfaces that are used for example in medical applications, such as in biological metrology or to process neural signals. More broadly, in the field of the Internet of Things (IOT), where it is necessary to considerably reduce the consumption of sensor nodes, there is a need for sensor interfaces that have very low electrical consumption. In order to reduce the consumed power, a sensor interface is generally put into standby mode, and is reactivated or re-awoken only when an event that is predefined for the sensor is detected. The detection of an event, which consists in extracting and identifying analogue parameters representative of the event from a temporal signal, implements a chain of signal processing operations in the analogue domain, consisting at least of bandpass filters and signal rectifiers.

One example of a circuit with a bandpass filter for extracting parameters from a signal representative of events is described in the article by S. Oh et al., "An Acoustic Signal Processing Chip With 142-nW Voice Activity Detection Using Mixer-Based Sequential Frequency Scanning and Neural Network Classification," in IEEE Journal of Solid-State Circuits, vol. 54, no. 11, pp. 3005-3016, November 2019. This paper presents an analogue extractor for extracting spectral parameters from a signal. This circuit, which constitutes the prior art for extractors for extracting parameters in order to detect waking based on events, consists of a plurality of filtering channels. The consumption of a single filtering channel is 5 nW, and the overall consumption of the circuit is 142 nW. Although this consumption is low, it is still too high for very-low-consumption sensor interfaces, in particular in low-throughput circuits.

There is then a need for circuits that make it possible to extract parameters representative of events in a signal exhibiting temporal variations, the consumption of which is less than around one hundred nanowatts.

Moreover, ultra-low-consumption sensor interfaces have to be robust and operate reliably in hostile environments, even when they are subject to significant manufacturing process, supply voltage and temperature variations (called PVT variations).

There is therefore the need for an ultra-low-consumption sensor interface that is robust to PVT variations.

SUMMARY OF THE INVENTION

One object of the invention is thus to overcome the drawbacks of the known techniques and to meet the above-mentioned needs.

In order to achieve the desired aim, what is proposed is an ultra-low-consumption solution that is robust to PVT variations, and for which signal processing is performed only in the phase domain.

According to one aspect, what is proposed is a bandpass filter configured to receive a temporally modulated periodic input signal Vin(t), and to deliver an output signal Vout(t), and comprising, in combination:

a phase comparator configured to receive, on a first input, the temporally modulated periodic input signal Vin(t) as first signal, and to generate an output signal with a variable duty cycle; coupled to an injection-locked oscillator configured to receive as input, the output signal from the phase comparator, and to generate a signal Vr(t) that is phase-offset with respect to the output signal from the phase comparator; said phase-offset signal being applied to a second input of the phase comparator as second input signal; and said output signal from the phase comparator being the output signal Vout(t) from the bandpass filter and being representative of the phase difference between the two input signals Vin(t) and Vr(t).

According to some particular independent or combined embodiments:

the phase comparator comprises circuits for comparing the input signals on their falling edges or on their rising edges.

the phase comparator comprises at least JK flip-flops or RS flip-flops.

the first input signal is a pulse width-modulated periodic signal.

the first input signal is a frequency-modulated periodic signal.

the first input signal is a phase-modulated periodic signal.

the injection-locked oscillator comprises at least RS flip-flops.

the phase comparator and the injection-locked oscillator are implemented using CMOS technology.

the filter additionally comprises a feedback circuit coupled to the injection-locked oscillator in order to control the output phase of said injection-locked oscillator.

In another aspect, the invention covers second-order or higher-order filters, comprising at least one bandpass filter as claimed.

In another aspect, the invention covers an interface circuit for a sensor that comprises a bandpass filter as claimed.

BRIEF DESCRIPTION OF THE DRAWINGS

Other features, details and advantages of the invention will become apparent upon reading the description provided with reference to the appended drawings, which are given by way of example and in which, respectively:

FIG. 9a and

FIG. 9b and

DETAILED DESCRIPTION

Figure 1:
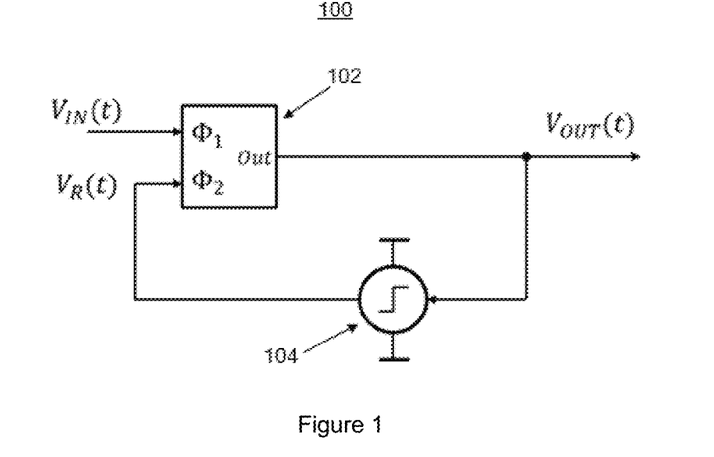
FIG. 1 schematically shows a bandpass filter according to one embodiment of the invention.

FIG. 1 schematically shows a bandpass filter 100 of the invention according to one embodiment, formed of a phase comparator circuit 102 and of an injection-locked oscillator 104 or ILO.

The general operating principle of the device of the invention 100 consists in the injection-locked oscillator 104 being looped back via the phase comparator 102. The phase comparator 102 receives an input signal Vin(t) on a first input or external input $\Phi_1$, and a second signal $V_R(t)$ on a second input or internal input $\Phi_2$.

The input signal $V_{IN}(t)$ is a modulated periodic signal that exhibits temporal variations, that is to say a frequency-modulated, phase-modulated or pulse width-modulated periodic signal or any other type of modulation involving the edges of the input signal $V_{IN}(t)$ being moved. The phase comparator compares the phases of the input signals, that is to say edges of the same kind (rising or falling edges) when the modulation is phase modulation or frequency modulation, or if the modulation is pulse width modulation, it compares the distance between two temporal positions of the input signals (between two edges of different kinds).

In the embodiment described, the input signal $V_{IN}(t)$ is a pulse width-modulated (PWM) periodic signal whose duty cycle is variable. In other embodiments, the same operating principles of the device of the invention apply to a frequency-modulated or phase-modulated periodic input signal.

Various known methods may be used to obtain a modulated input signal. To phase-modulate a signal, it is possible to use an ILO as simple dynamic phase shifter, to lock it to a lock signal, and control its phase offset dynamically through a control voltage. Pulse width modulation PWM may be achieved by comparing a modulating signal to a ramp, or be ILO PWM modulation. An ILO PWM modulator consists of an ILO and of a phase comparator. Its operation is as follows: an ILO is locked by a signal $V_{LOCK}$ at a frequency $f_{LOCK}$. A static phase offset occurs between the output signal from the ILO $V_{ILO}$, and $V_{LOCK}$. This phase offset is controlled dynamically by a modulating signal $V_{CTRL}$ applied to the dynamic control input of the ILO. The phases of the signals $V_{LOCK}$ and $V_{ILO}$ are compared by the phase comparator (reacting on rising or falling edge). The resultant signal $V_{PWM}$ is a signal with a variable duty cycle, proportional to the phase offset $\Delta\Phi$ by a ratio $2\pi$. By calling $\alpha_{PWM}$ the duty cycle of $V_{PWM}$, this gives $$\alpha_{PWM} = \frac{\Delta\Phi}{2\pi}.$$

Figure 2:
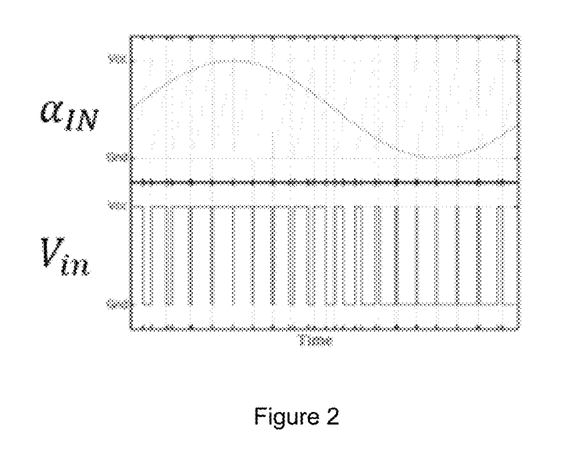
FIG. 2 shows a graph illustrating the pulse width modulation PWM of a signal.

FIG. 2 illustrates pulse width modulation of a signal $V_{in}$ by a modulator $\alpha_{IN}$, where it may be seen that the modulated information is contained in the variation in the duty cycle of the signals.

Returning to FIG. 1, the phase comparator 102 delivers an output signal $V_{OUT}(t)$ on an output Out. The output signal $V_{OUT}(t)$ also becomes the locking input for the injection-locked oscillator 104.

The injection-locked oscillator 104 delivers a signal $V_R(t)$ that is applied to a second input or internal input $t_2$ of the phase comparator, as second input signal.

Figure 3:
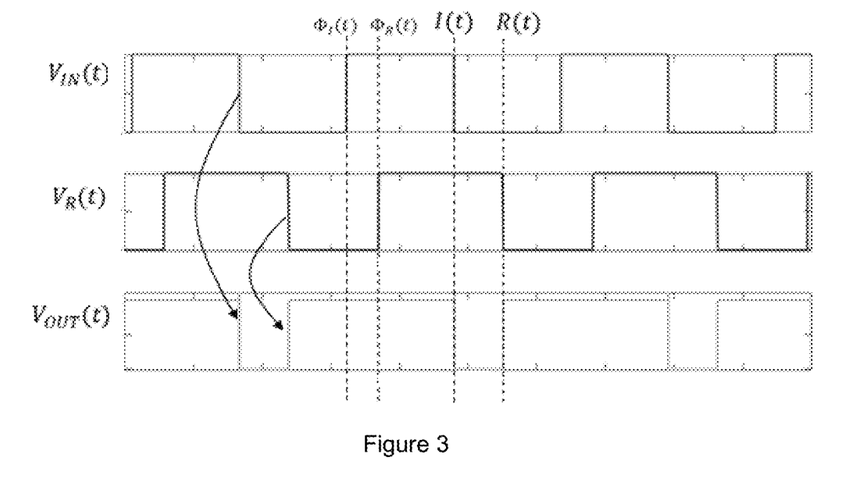
FIG. 3 shows a timing diagram of the signals of the filter from FIG. 1 according to one embodiment.

FIG. 3 illustrates a timing diagram of the input $V_{IN}(t)$, $V_R(t)$ and output $V_{OUT}(t)$ signals of the phase comparator 104 of the bandpass filter from FIG. 1.

The various references illustrated in FIG. 3 are:
$\Phi_I(t)$: the phase of the input signal $V_{IN}(t)$, represented by the position of its rising edge. $\Phi_R(t)$: the phase of the input signal $V_R(t)$, represented by the position of its rising edge.

I(t): the variation in angular position of the falling edge of the signal $V_{IN}(t)$.

R(t): the variation in angular position of the falling edge of the signal $V_R(t)$.

The phase comparator 102 operates sequentially: it first of all detects the change of the first input signal $V_{IN}(t)$ applied to the first input $\Phi_1$ to a falling edge in order to invert the value of the output signal $V_{OUT}(t)$, and then remain at this value until detecting the change of the second input signal $V_R(t)$ applied to the second input $\Phi_2$ to a falling edge in order to invert the value of the output signal $V_{OUT}(t)$. It is thus possible to observe the duty cycle of the output signal $V_{OUT}(t)$.

The phase comparator 102 reconstructs a pulse width modulation PWM resulting from the phase difference between the falling edges of the input signals $V_{IN}(t)$ and $V_R(t)$ applied respectively to the inputs $\Phi_1$ and $\Phi_2$. The result of the phase comparison is the output signal $V_{OUT}(t)$, which has a variable duty cycle representative of the phase difference between the input signals $V_{IN}(t)$ and $V_R(t)$ The duty cycle of the output signal $V_{OUT}(t)$ is thus the derivative of the duty cycle of the input signal $V_{IN}(t)$. The output signal $V_{OUT}(t)$ is a pulse width-modulated signal that contains the information to be processed.

Advantageously, the circuit of the invention, through the combination of the two circuits—the phase comparator 104 and the injection-locked oscillator 102—makes it possible to derive the duty cycle of the output signal. The proposed device is simple since it consists of only two elements: a phase comparator coupled to an injection-locked oscillator in accordance with the described arrangement.

Figure 4:
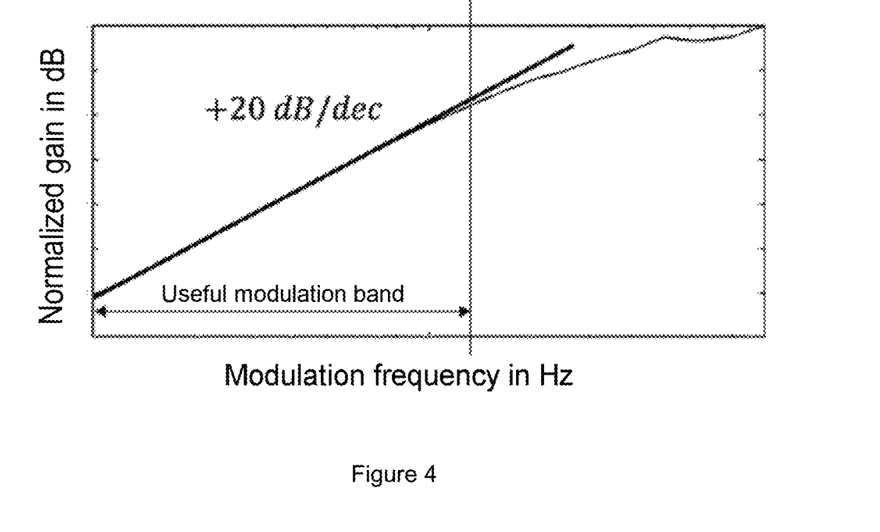
FIG. 4 shows a graph illustrating a Bode plot of the filter from FIG. 1.

FIG. 4 shows a Bode plot resulting from an electrical simulation of the circuit 100 of the invention according to one embodiment such as that from FIG. 1. A pulse width-modulated square-wave signal was applied to the external input of the phase comparator in order to observe the duty cycle of the output signal. The graph of FIG. 4 shows the plot of the gain of the assembly $G_{dB}$, that is to say the amplitude of the variation in the duty cycle of the output signal, normalized by the amplitude of the variation in the duty cycle of the input signal. It is possible to observe a slope of +20 db/decade, which is characteristic of the differentiating behaviour of the system. It is possible to define a useful modulation band as being the modulation frequency interval over which the differentiator may be approximated as ideal.

Advantageously, the device may be synchronized with the frequency of the input signal in order to avoid having to use an additional reference oscillator to detect the phase of the output signal, as in known devices.

Since the cutoff frequency of the circuit depends on easily adjustable variables (for example by the size of capacitors), it is possible to vary the cutoff frequency and the gain of the assembly.

In one embodiment, the locking range of the injection-locked oscillator 102 may be adjusted depending on the needs of an application, thereby allowing the circuit to remain locked over a wide frequency range. This ensures that the system is robust when faced with process, voltage and temperature variations. When used for a sensor interface in environments exhibiting temperature variations, the circuit may advantageously be supplied with power from a battery whose supply voltage decreases over time.

In one embodiment, the phase comparator 104 for comparing the phase of the input signals $V_{IN}(t)$ and $V_R(t)$ on their rising edge is formed from JK flip-flops. A person skilled in the art will be able to contemplate various basic implementations of the phase comparator in order to adapt it to the detection based on the kind of active edge chosen, whether rising or falling.

Figure 5:
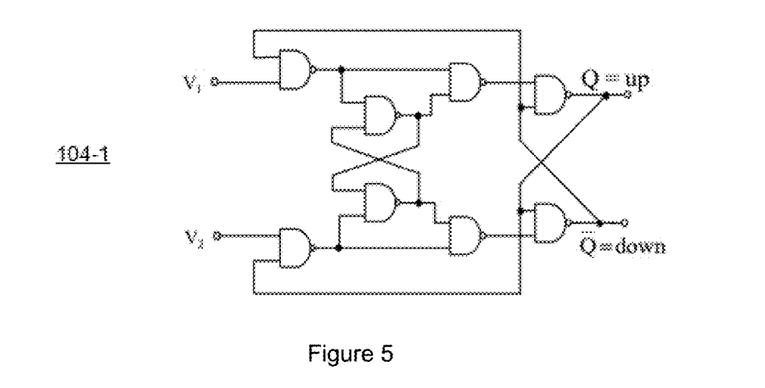
FIG. 5 shows an implementation of a phase comparator circuit according to one embodiment.
Figure 6:
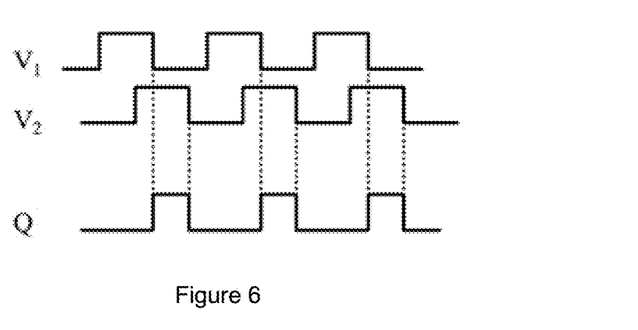
FIG. 6 shows a timing diagram of the input and output signals of a phase comparator circuit.

FIG. 5 illustrates an example of a circuit 104-1 based on JK flip-flops and implemented with NAND gates. The circuit comprises two inputs $V_1$ and $V_2$ whose phase is compared, and delivers an output Q. The inverse output is denoted $\overline{Q}$. FIG. 6 shows a timing diagram of the input signals $V_1$ and $V_2$ and of the output signal Q of the JK flip-flop from FIG. 5, where it is possible to observe the toggling of the output signal upon detection of the falling edges of each of the input signals $V_1$ and $V_2$. This type of phase comparator is a digital circuit that operates with square-wave signals.

Figure 7:
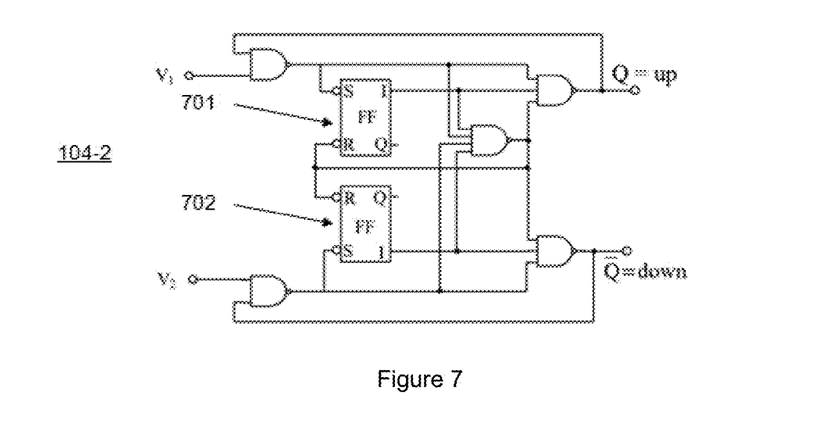
FIG. 7 shows an implementation variant of a phase comparator circuit.

In another embodiment, the phase comparator may be based on RS flip-flops. FIG. 7 schematically illustrates a known exemplary implementation of a double RS flip-flop (701, 702) phase comparator 104-2 having two inputs $V_1$ and $V_2$ and delivering an output Q and the inverse output $\overline{Q}$.

A person skilled in the art will understand that the exemplary implementations in FIGS. 5 and 7 are not limiting, and that any variant implementation may be considered, whether based on JK flip-flops or RS flip-flops, controlled on an active edge (rising or falling). Moreover, any phase comparator formed with logic gates is not limiting for the bandwidth. Specifically, logic gates may be implemented using various technologies, both using CMOS logic and CML logic or other logic, with a bandwidth that may range up to several GHz.

Figure 8:
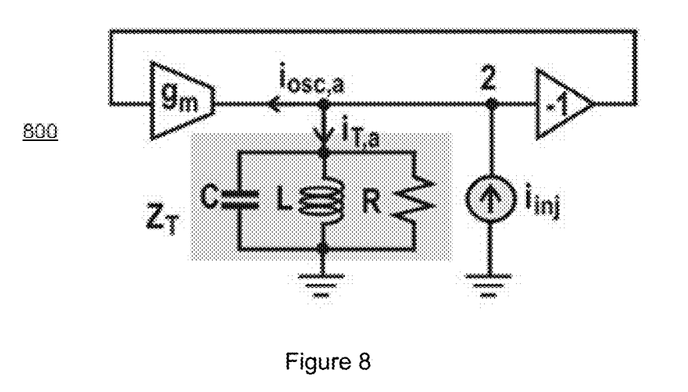
FIG. 8 schematically shows an injection-locked oscillator.

FIG. 8 illustrates a basic diagram of a model of an injection-locked oscillator 800. As is known, an injection-locked oscillator (ILO) is a type of oscillator that has a free oscillating frequency $f_0$ when no input signal is applied thereto, and when a synchronization signal is applied thereto with a frequency $f_{lock}$ that is within certain limits with respect to the frequency $f_0$, the oscillator locks to this frequency. In the example of FIG. 8, the ILO that is shown with ideal components is a harmonic ILO for which the synchronization signal that is applied is an injection current $I_{inj}$ that allows the oscillator to track the synchronization or injection frequency. The blocks "−1", "$g_m$" and "R,L,C" represent an oscillator whose output signal is read off at the point "2". The current $I_{inj}$ corresponds to the injection current. This is an analogue signal having a given amplitude, and oscillating at the synchronization frequency $f_{lock}$ (or $f_{inj}$).

The described injection principle is shared by all ILO oscillators used for various applications, such as frequency division or multiplication, frequency calibration or even in phase-locked loops (PLL). The following articles present various ILO oscillators:

R. Adler, "A Study of Locking Phenomena in Oscillators," in Proceedings of the IRE, vol. 34, no. 6, pp. 351-357, June 1946. doi: 10.1109/JR-PROC.1946.229930;

F. Yuan, "Injection-Locking in Mixed-Mode Signal Processing", Springer, 2020. Doi: https://doi.org/10.1007/978-3-030-17364-7

Figure 9A:
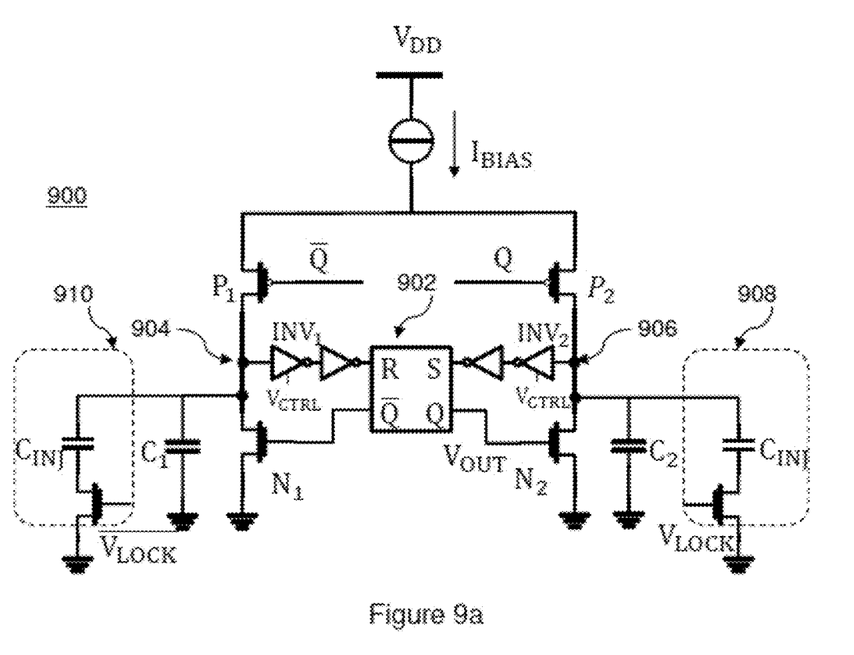

FIG. 9a shows an implementation of an injection-locked oscillator 900 according to one embodiment of the circuit of the invention. The ILO 900 is based on an RS flip-flop 902 having R and S inputs and Q and $\overline{Q}$ outputs. By analogy to FIG. 1, the inputs of the ILO correspond to the output signal $V_{OUT}(t)$ from the phase comparator 102. The R input is coupled, via a series connection of a pair of inverters, to a capacitive intermediate node 904 between two transistors $P_1$, $N_1$. The intermediate node 904 is coupled to a charging capacitor $C_1$. The S input is coupled, via a series connection of another pair of inverters, to a capacitive intermediate node 906 between two transistors $P_2$, $N_2$. The intermediate node 906 is coupled to a charging capacitor $C_2$.

The Q output of the RS flip-flop supplies an output signal $V_{OUT}$ corresponding, by analogy to FIG. 1, to the signal $V_R(t)$ from the ILO 104 that is injected into the phase comparator 102. The Q output is coupled to the gate of the transistor $N_2$, which may be for example an N-channel MOS transistor (NMOS), coupled, by its main conduction nodes, between the intermediate node 906 and ground. The Q output is additionally coupled to the gate of the transistor $P_2$, which may be for example a P-channel MOS transistor (PMOS), coupled, by its main conduction nodes, between the intermediate node 906 and a supply voltage $V_{DD}$ by way of a current source supplying a current $I_{BIAS}$.

The $\overline{Q}$ output of the RS flip-flop 902 supplies an inverted output signal. Similarly, it is coupled to the gate of the transistor $N_1$, which may be for example an N-channel MOS transistor (NMOS), coupled, by its main conduction nodes, between the intermediate node 904 and ground. The $\overline{Q}$ output is additionally coupled to the gate of the transistor $P_1$, which may be for example a P-channel MOS transistor (PMOS), coupled, by its main conduction nodes, between the intermediate node 904 and the supply voltage $V_{DD}$ by way of the current source supplying the current $I_{BIAS}$.

Figure 9B:
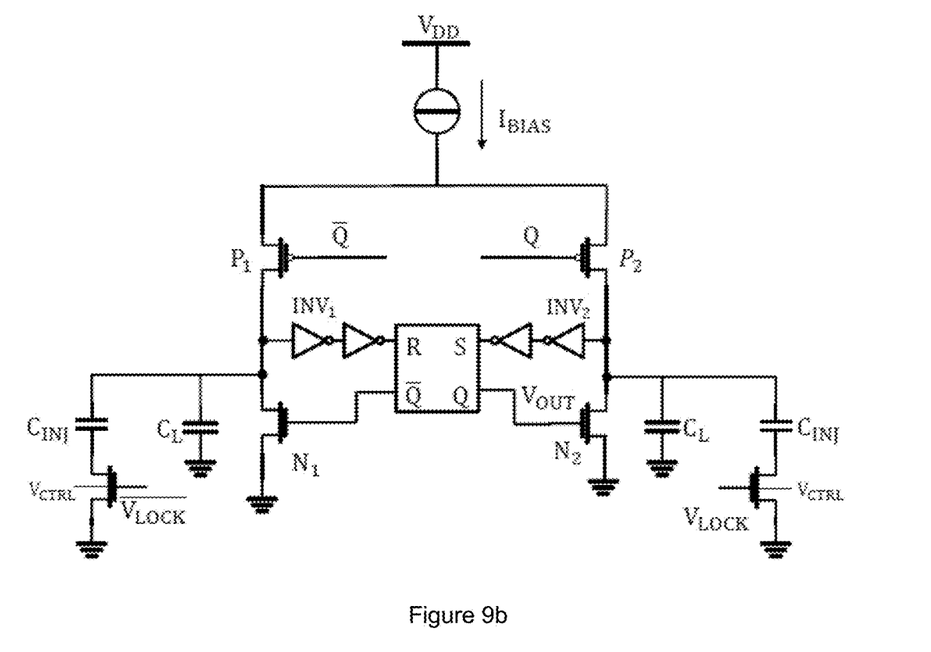

The ILO additionally comprises a locking circuit formed of two similar symmetrical assemblies 908, 910. Each assembly identically comprises an injection capacitor $C_{INJ}$ coupled between the intermediate node, respectively 904 or 908, and ground by way of a control transistor receiving, on its input, a locking signal, respectively $V_{LOCK}$, $\overline{V_{LOCK}}$. Each control transistor constitutes a "switch" whose conductivity may be modified by controlling its substrate voltage. This voltage $V_{CTRL}$ may be applied to its substrate if it is a transistor implemented using conventional CMOS technology, or to its rear face if it is a transistor implemented using FDSOI technology, as shown in FIG. 9b. The signal $V_{CTRL}$ modifies the conductivity of the transistors of the locking assemblies 908 and 910, involving a leakage current in the corresponding branches. This leakage current makes it possible to vary the charging slope of the injection capacitors $C_{INJ}$. This slope variation leads to dynamic control of the phase offset of the ILO.

As indicated above, the ILO looped back to the phase comparator creates a phase differentiation of the output signal $V_{OUT}(t)$ from the phase comparator in order to generate the signal $V_R(t)$ whose phase is compared to that of the input signal $V_{IN}(t)$ of the phase comparator.

Figure 9C:
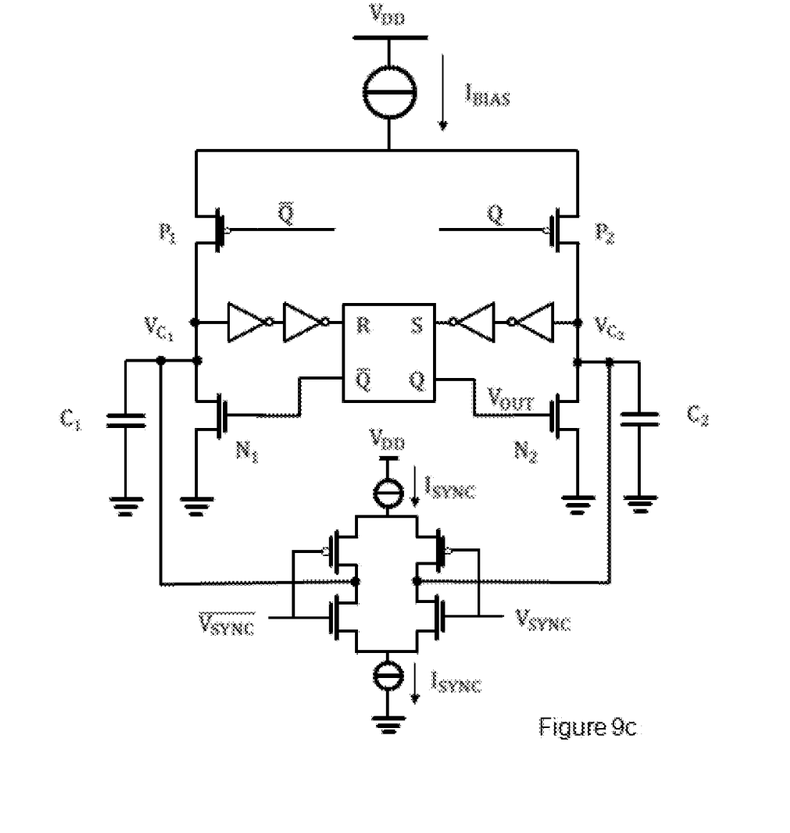
FIG. 9c show implementation variants of an injection-locked oscillator.

FIG. 9c illustrates another variant implementation of an injection-locked oscillator.

The following equations (1) to (6) make it possible to demonstrate the operation of the circuit of the invention, that is to say to write its transfer function (7). The various terms used in the equations take the definitions below:

$\Phi_I(t)$: the phase of the input signal $V_{IN}(t)$, represented by the position of its non-active edge.

$\alpha_I(t)$: the duty cycle of the input signal $V_{IN}(t)$. $\Phi_R(t)$: the phase of the signal $V_R(t)$, represented by its non-active edge.

$\alpha_R(t)$: the duty cycle of the signal $V_R(t)$.

K is the coefficient of proportionality between $\Phi_R$ and the synchronization frequency $f_{lock}$ when this is constant.

R(t) and I(t): the angular position of the active edges of the signals $V_R(t)$ and $V_{IN}(t)$, respectively.

$\overline{V_{OUT}}$: the inverted output signal.

Considering that the phase of the input signal is zero, it is possible to write:

$$I(t) = 2\pi(\alpha_{IN}(t) - \tfrac{1}{2}) \tag{1}$$

The duty cycle $\overline{\alpha}(t)$ of the signal $\overline{V_{OUT}}$ is defined by:

$$\overline{\alpha}(t) = \frac{R(t) - I(t)}{2\pi}. \tag{2}$$

Through approximation to small signals, it may be considered that the operating equation of an ILO when its synchronization signal is phase-modulated may be written:

$$\tau \frac{d\Phi_{ILO}}{dt} + \Phi_{ILO} = \frac{K}{2\pi} \frac{d\Phi_{SYNC}}{dt}, \tag{3}$$

where the phase $\Phi_{ILO}$ of the output signal is written as the derivative of the synchronization signal.

By assuming that the ILO reacts on the angular position of the falling edge of $V_{OUT}$, which is itself equal to (t), and taking into account the variation in angular position R(t)−I(t) at the output of the ILO as it is referenced with respect to the synchronization signal, equation (3) becomes:

$$\tau \frac{d(R(t) - I(t))}{dt} + (R(t) - I(t)) = \frac{K}{2\pi} \frac{dI(t)}{dt}. \tag{4}$$

Combining equation (4) with equation (2) gives:

$$\tau \frac{d\overline{\alpha}}{dt} + 2\pi \overline{\alpha} = K \frac{d\alpha_{IN}}{dt}. \tag{5}$$

Then, performing a Laplace transform on equation (5) gives:

$$\frac{\overline{\alpha}(p)}{\alpha_{IN}(p)} = \frac{K}{2\pi} \cdot \frac{p}{1 + \tau p}. \tag{6}$$

Considering that $\alpha(t) = 1 - \overline{\alpha(t)}$, it is then considered that $\alpha(p) = -\overline{\alpha(p)}$.

The transfer function of the filter is therefore written according to the following equation:

$$\frac{\alpha(p)}{\alpha_{IN}(p)} = -\frac{K}{2\pi} \cdot \frac{p}{1 + \tau p}, \tag{7}$$

which governs the behaviour of the filter with a time constant $\tau$.

Figure 10:
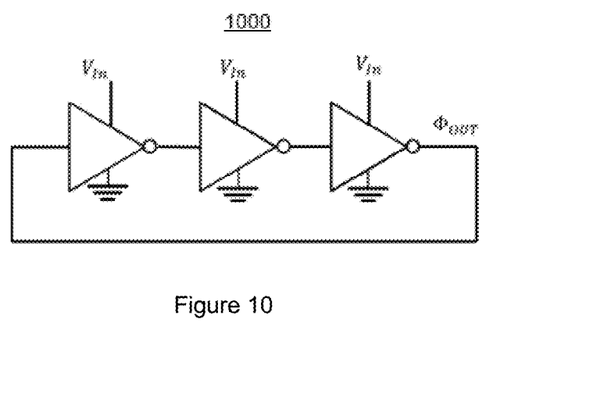
FIG. 10 schematically shows a ring oscillator VCO.

One advantageous application of the circuit of the invention is that of filters in the time domain. Known pulse width modulation PWM signal filtering techniques mainly use ring oscillator (RO) filters. A voltage-controlled oscillator (VCO) formed of ROs may be used as an integrator. FIG. 10 schematically shows a ring oscillator VCO 1000 whose output frequency $f_{out}$, which is controlled by the control voltage $V_{in}$, is written:

$$f_{out} = K_{VCO} V_{in} \tag{8}.$$

The output phase $\Phi_{out}$ of the VCO is defined by the equation:

$$f_{out} = \frac{1}{2\pi} \frac{d\Phi_{out}}{dt}. \tag{9}$$

Performing a Laplace transform on equation (9) gives the following equation:

$$\frac{\Phi_{out}(p)}{V_{in}(p)} = 2\pi \frac{K_{VCO}}{p}. \tag{10}$$

The phase of the output signal $\Phi_{out}$ is therefore the image of the integrated signal $V_{in}$. This shows that a voltage-controlled oscillator VCO is a block that may be used as integrator block for an analogue signal in the phase domain. This block may be looped back using a phase comparator in order to synthesize a transfer function.

The article by Leene, Lieuwe B. and Timothy G. Constandinou. "Time Domain Processing Techniques Using Ring Oscillator-Based Filter Structures." IEEE Transactions on Circuits and Systems I: Regular Papers 64 (2017): 3003-3012, proposes to use a looped-back ring VCO to synthesize a transfer function of a first-order filter with a cutoff angular frequency $k_1$ (constant dependent on the parameters of the filter) in the form of the following equation:

$$F(p) = \frac{1}{1 + \frac{p}{k_1}}. \tag{11}$$

A VCO may thus be used as main block for the filter synthesis in the time domain, with additional components (phase comparator, logic gates). This type of filter may be expanded to higher-order transfer functions. The operation of a second-order filter is similar to that of a 1st-order filter, with the use of additional components.

The abovementioned article by Leene presents a second-order bandpass filter acting on pulse width-modulated signals. Its input variable is a duty cycle, and its output variable is also a duty cycle. Although the consumption for this filter is less than around one hundred nW (given for 73 nW), it has drawbacks.

Specifically, using a VCO leads to intrinsic phase noise because the circuits are not synchronized. A phase conversion to analogue is necessary to perform a second integration and achieve second-order analogue filter synthesis.

Moreover, this architecture requires the use of numerous components, which are, for a second-order filter, at least:
  two phase comparators: an XOR gate and a comparator;
  switched current sources, for use similar to a charge pump for creating the control current for the oscillator;
  a reference phase operating at the same frequency as the ring oscillator (unsynchronized circuits);
  capacitors and transistors for performing an integration in order to generate the second-order filter. This also makes the circuit sensitive to PVT variations.

Using a plurality of components additionally leads to numerous dynamic currents during transistor switching operations, leading to greater consumption and current leakages in the circuit.

Therefore, advantageously, the device 100 of the invention makes it possible to simplify the architecture of filters in the time domain, by using only two components, an injection-locked oscillator ILO looped back via a phase comparator.

Still advantageously, the device of the invention allows signal processing only in the phase domain (differential measurement of the phase offsets) where the ILO is used as elementary differentiation block on its useful band, thus allowing a decrease in phase noise.

Lastly, since the circuit of the invention processes a signal in the phase domain, the dynamics of the information to be processed do not depend on the amplitude of the signal $V_{in}(t)$, but on the temporal position of its falling edge, which may change by virtue of a modulation, either a frequency modulation or a phase modulation or a pulse width modulation. The amplitude of the signals $V_{in}(t)$ and Vout(t) may then be reduced without changing their signal-to-noise ratio, and the supply voltage of the circuit may therefore be reduced. Since the consumption of the circuit depends on the square of the supply voltage, this is then effectively reduced by the device of the invention. In simulation, for a circuit locked at 32 kHz, the simulated consumption of the circuit of the invention is 1.8 nW for an integrated phase noise of 0.11°.

Therefore, in comparison with the circuit from the above-mentioned paper by Leene, the reduction in the number of components makes it possible to reduce current leakages in the circuit, as well as the dynamic currents linked to the transistor switching operations, and also makes it possible to lower consumption.

Figure 11:
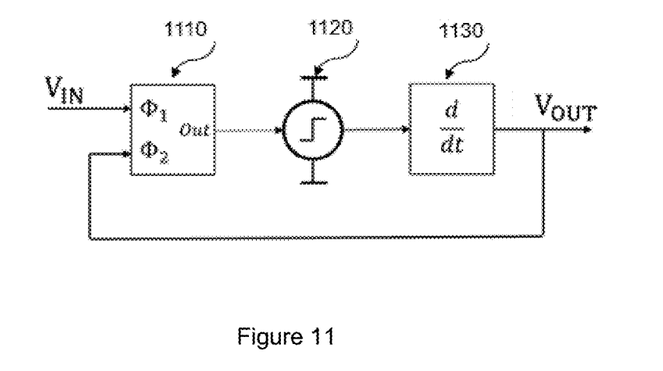
FIG. 11 schematically shows a second-order bandpass filter according to one embodiment.
Figure 12:
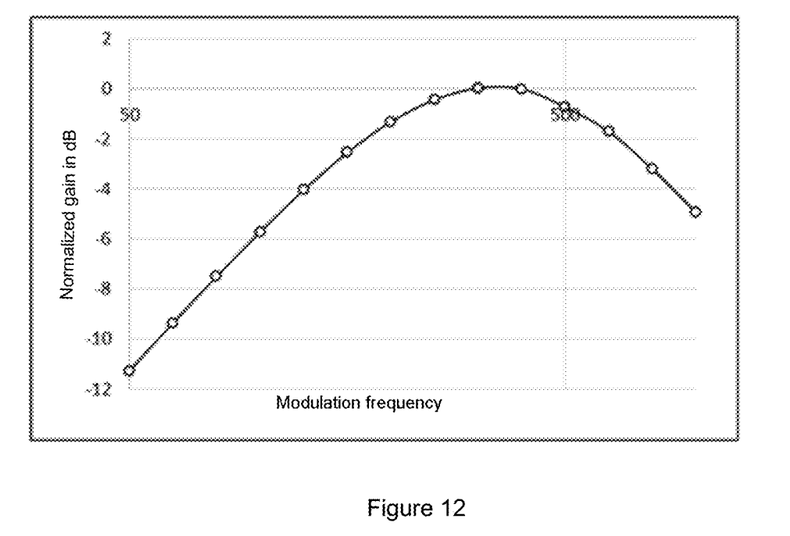
FIG. 12 shows a graph illustrating a Bode plot of the filter from FIG. 11.

FIG. 11 illustrates the architecture of a second-order ILO filter 1100 acting on a PWM-modulated input signal $V_{IN}$, and whose output signal $V_{OUT}$ is also a PWM-modulated signal, formed of a phase comparator 1110, of an ILO 1120 and of a differentiator block 1130. Simulations of a second-order filter implemented in accordance with the principles of the invention give a consumption of the order of 3 nW, far lower than the consumption of circuits from the prior art, and its frequency response, for a duty cycle at input with a constant amplitude and varying frequency, is shown in FIG. 12.

Figure 13:
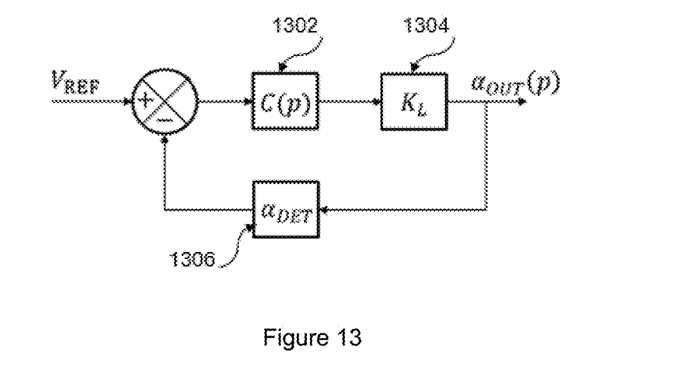
FIG. 13 schematically shows a control circuit for synchronizing the circuit of the invention, according to one embodiment.

In one embodiment, in order to stabilize the output duty cycle at rest as a function of temperature, the device of the invention comprises a feedback loop. Specifically, the duty cycle of the output signal, at rest, may vary as a function of temperature. To counter this phenomenon, it is possible to adjust it by controlling the phase at equilibrium of the output signal from the ILO (the phase of the ILO when the input duty cycle of the differentiator is constant, and the circuit therefore operates in static state). Adding a feedback loop makes it possible to control the output phase of the ILO in order to keep the duty cycle of the differentiator constant as a function of temperature. This loop takes the form of a conventional control system as illustrated schematically in FIG. 13, where the following blocks and terms are defined:

$V_{REF}$: the initial phase control signal in V;
C(p) (1302): the transfer function of a control corrector;

$$K_L = \frac{\Phi_{ILO}}{V_{CTRL}} \text{ (1304):}$$

the coefficient of proportionality in 1/V between the output duty cycle and the control signal of the ILO;

$$\alpha_{DET} = \frac{v_r}{\alpha_{OUT}} \text{ (1306):}$$

the coefficient of proportionality in V between the output duty cycle of the differentiator and the feedback signal of the feedback loop. This block may be formed by a charge pump.

$\alpha_{OUT}$: output duty cycle.

Figure 14:
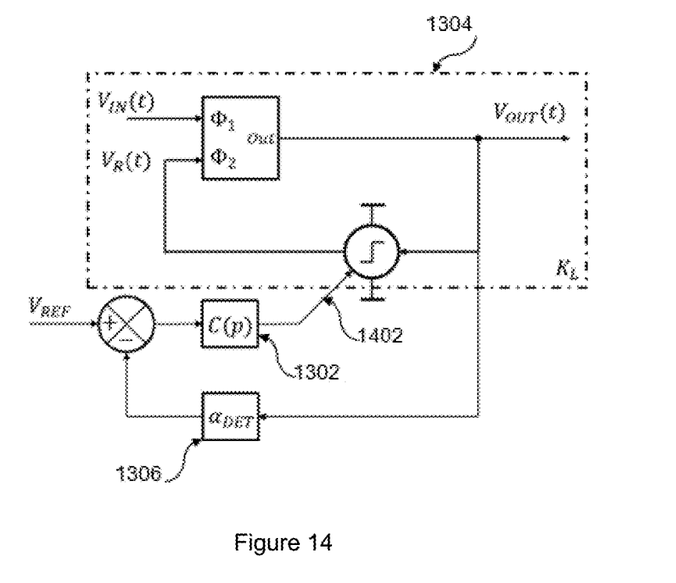
FIG. 14 shows a variant embodiment of the bandpass filter from FIG. 1 comprising the control circuit from FIG. 13.

FIG. 14 illustrates an implementation of the circuit of the invention controlled with a feedback loop according to FIG. 13. The duty cycle of the output signal $V_{OUT}$ is detected by the block 1306 $\alpha_{DET}$ and converted into a DC voltage. It is then compared with a voltage $V_{REF}$ by way of an error amplifier. The result is then filtered 1302 and transmitted on the control input 1402 of the ILO. The assembly forms a control system whose control is $V_{REF}$ and which thus allows temperature stability, insofar as the output duty cycle $V_{OUT}$ will follow the control $V_{REF}$.

The present description illustrates one preferred implementation of the invention, but this is not limiting. Some examples are chosen so as to allow a good understanding of the principles of the invention and a specific application, but these are in no way exhaustive, and should allow a person in the art to provide modifications and implementation variants while keeping the same principles.

The invention claimed is:
1. A bandpass filter configured (i) to receive a temporally modulated periodic input signal Vin(t) and (ii) to deliver an output signal Vout(t), the bandpass filter consisting of:
  a phase comparator configured to receive, on a first input, the temporally modulated periodic input signal Vin(t) as first signal, and to generate an output signal with a variable duty cycle; and
  an injection-locked oscillator (i) coupled to the phase comparator and (ii) configured to directly receive, as input, the output signal from the phase comparator and to generate a signal Vr(t) that is phase-offset with respect to the output signal from the phase comparator;
  said phase-offset signal being applied to a second input of the phase comparator as second input signal; and
  said output signal from the phase comparator being the output signal Vout(t) from the bandpass filter and being representative of the phase difference between the two input signals Vin(t) and Vr(t).

2. The filter according to claim 1, wherein the phase comparator comprises circuits for comparing the input signals on their falling edges or on their rising edges.

3. The filter according to claim 1, wherein the phase comparator comprises at least JK flip-flops or RS flip-flops.

4. The filter according to claim 1, wherein the first input signal is a pulse width-modulated periodic signal.

5. The filter according to claim 1, wherein the first input signal is a frequency-modulated periodic signal.

6. The filter according to claim 1, wherein the first input signal is a phase-modulated periodic signal.

7. The filter according to claim 1, wherein the injection-locked oscillator comprises at least RS flip-flops.

8. The filter according to claim 1, wherein the phase comparator and the injection-locked oscillator are implemented using CMOS technology.

9. The filter according to claim 1, additionally comprising a feedback circuit coupled to the injection-locked oscillator in order to control the output phase of said injection-locked oscillator.

10. An interface circuit for a sensor comprising a bandpass filter according to claim 1.

11. A second-order or higher-order filter, comprising at least one bandpass filter configured to receive a temporally modulated periodic input signal Vin(t) and to deliver an output signal Vout(t), the bandpass filter consisting of:

a phase comparator configured to receive, on a first input, the temporally modulated periodic input signal Vin(t) as first signal, and to generate an output signal with a variable duty cycle; and an injection-locked oscillator coupled to the phase comparator and configured to directly receive, as input, the output signal from the phase comparator and to generate a signal Vr(t) that is phase-offset with respect to the output signal from the phase comparator;

said phase-offset signal being applied to a second input of the phase comparator as second input signal; and said output signal from the phase comparator being the output signal Vout(t) from the bandpass filter and being representative of the phase difference between the two input signals Vin(t) and Vr(t).

* * * * *